US009999140B2

(12) United States Patent
Jeong (10) Patent No.: US 9,999,140 B2
(45) Date of Patent: Jun. 12, 2018

(54) LIGHT EMITTING DIODE LIGHT ENGINE

(71) Applicant: Jae Hong Jeong, Saratoga, CA (US)

(72) Inventor: Jae Hong Jeong, Saratoga, CA (US)

( * ) Notice: Subject to any disclaimer, the term of this patent is extended or adjusted under 35 U.S.C. 154(b) by 308 days.

(21) Appl. No.: 14/883,241

(22) Filed: Oct. 14, 2015

(65) Prior Publication Data
US 2016/0146440 A1    May 26, 2016

Related U.S. Application Data

(60) Provisional application No. 62/083,467, filed on Nov. 24, 2014.

(51) Int. Cl.
| | | |
|---|---|---|
| F21V 23/00 | (2015.01) | |
| F21K 99/00 | (2016.01) | |
| H05K 1/18 | (2006.01) | |
| H05K 1/11 | (2006.01) | |
| H05K 1/14 | (2006.01) | |
| H05K 3/46 | (2006.01) | |
| H05K 3/28 | (2006.01) | |

(52) U.S. Cl.
CPC ........... *H05K 3/4697* (2013.01); *H05K 1/186* (2013.01); *H05K 3/287* (2013.01); *H05K 2201/10106* (2013.01)

(58) Field of Classification Search
CPC ........ F21V 23/005; F21V 9/56; F21V 23/001; H05K 1/115; H05K 1/144; H05K 1/181
See application file for complete search history.

(56) References Cited

U.S. PATENT DOCUMENTS

2012/0153311 A1 * 6/2012 Yuan ..................... F21K 9/90
257/88

* cited by examiner

*Primary Examiner* — Joseph L Williams (57) ABSTRACT

A light emitting diode (LED) light engine includes: an LED; an LED driver for driving the LED; a bottom printed circuit board (PCB), the LED and the LED driver being securely mounted to the bottom PCB; and a top PCB secured to the bottom PCB, the top PCB including first and second cavities for receiving the LED and the LED driver therein. The LED light engine further includes a layer potted over the LED and formed of material containing a phosphor, or a plate that is disposed over the LED and secured to the top PCB and includes a layer formed of material containing a phosphor. The phosphor is excited by the light emitted from the LEDs to the intensity distribution over the wavelength of the light emitted by the LED.

15 Claims, 8 Drawing Sheets

LIGHT EMITTING DIODE LIGHT ENGINE

CROSS REFERENCES

This application claims the benefit of U.S. Provisional Applications No. 62/083,467, filed on Nov. 24, 2014, entitled "Method for fabricating an LED module," which is hereby incorporated by reference in its entirety.

BACKGROUND OF THE INVENTION

The present invention relates to lighting devices, and more particularly, to light emitting diode (LED) light engines.

Figure 1:
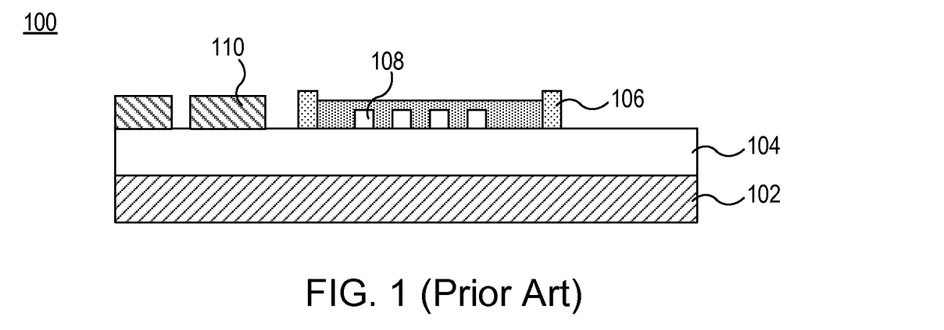
FIG. 1 shows a schematic diagram of a conventional LED module.

Due to the concept of low energy consumption, LED lamps are prevailing and considered a practice for lighting in the era of energy shortage. Typically, an LED lamp includes an LED module, having LEDs and a driving circuit. FIG. 1 shows a conventional LED module 100. As depicted, the LED module 100 includes a bottom substrate 102 and a top substrate 104. Typically, the top substrate 104 is formed of a PCB so that circuits are formed on the top surface of the top substrate 104. One or more LEDs 108 are mounted on the top substrate 104. The bottom substrate 102 is typically formed of metal and secured to the top substrate 104. Typically, the bottom substrate 102 does not include any circuit and merely provides mechanical strength for the top substrate 104.

To protect the LEDs 108 and provide a space for holding phosphor potting, a dam 106 is also mounted on the top substrate 104. Also, various types of sub-printed-circuit-board (PCB) components 110 are mounted on the top substrate 104. The dam 106 and sub-PCB components 110 can increase the manufacturing cost and the form factor of the LED module 100. As such, there is a need for an LED module (or LED light engine) that has a small form factor to thereby reduce the manufacturing cost without compromising the mechanical strength.

SUMMARY OF THE INVENTION

In one embodiment of the present disclosure, a light emitting diode (LED) light engine includes: an LED; an LED driver for driving the LED; a bottom printed circuit board (PCB), the LED and the LED driver being securely mounted to the bottom PCB; and a top PCB secured to the bottom PCB, the top PCB including first and second cavities for receiving the LED and the LED driver therein. The LED light engine further includes a layer potted over the LED and formed of material containing a phosphor or a plate that is disposed over the LED, secured to the top PCB and includes a layer formed of material containing a phosphor.

These and other features, aspects and advantages of the present invention will become better understood with reference to the following drawings, description and claims.

DETAILED DESCRIPTION OF THE INVENTION

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, and a device.

Components shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component.

Furthermore, connections between components within the figures are not intended to be limited to direct connections. Also, additional or fewer connections may be used. It shall also be noted that the terms "coupled" "connected" or "communicatively coupled" shall be understood to include direct connections, indirect connections through one or more intermediary devices.

Furthermore, one skilled in the art shall recognize: (1) that certain steps may optionally be performed; (2) that steps may not be limited to the specific order set forth herein; and (3) that certain steps may be performed in different orders, including being done contemporaneously.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. The appearances of the phrases "in one embodiment," "in an embodiment," or "in embodiments" in various places in the specification are not necessarily all referring to the same embodiment or embodiments.

Figure 2A:
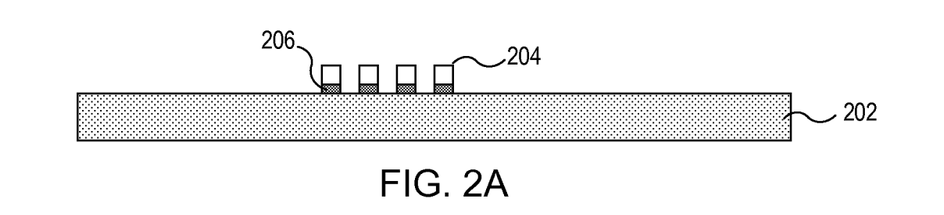
FIGS. 2A-2C show cross sectional views of a bottom PCB of an LED light engine, illustrating steps for processing the bottom PCB in accordance with embodiments of the present invention.
Figure 2B:
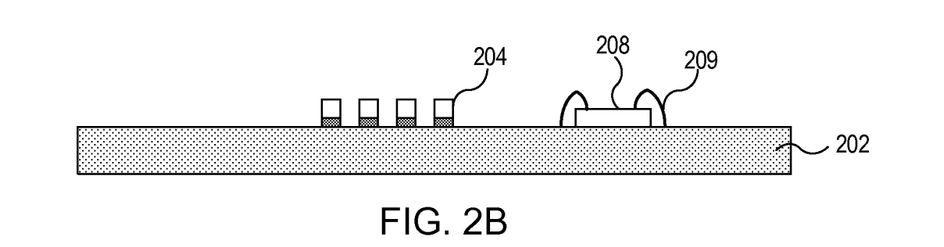
Figure 2C:
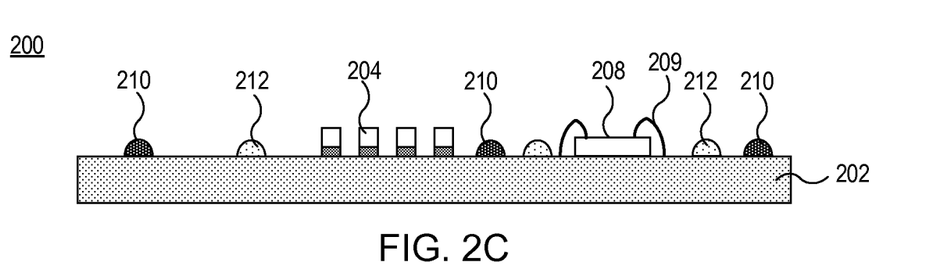
Figure 2D:
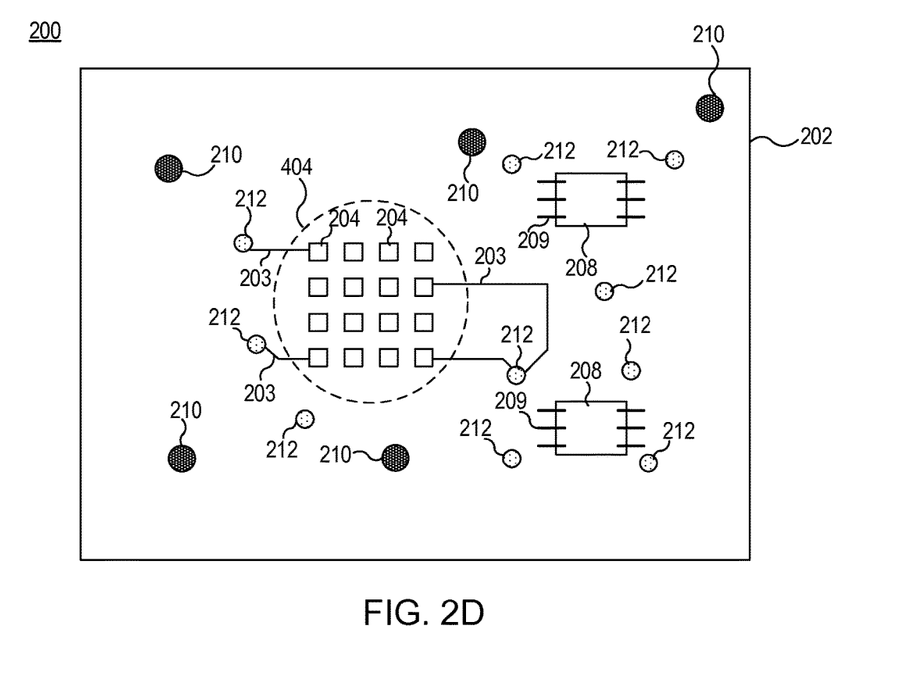
FIG. 2D shows a top view of the bottom PCB in FIG. 2C in accordance with embodiments of the present invention.

FIGS. 2A-2C show cross sectional views of a bottom portion 200 of an LED light engine, illustrating steps for processing the bottom portion in accordance with embodiments of the present invention. FIG. 2D shows a top view of the bottom portion 200 in FIG. 2C in accordance with embodiments of the present invention. As depicted in FIG. 2A, the bottom PCB 202 includes one or more circuits are 203 formed on the top surface of the bottom PCB 202.

In embodiments, one or more LEDs 204 are mounted on the bottom PCB 202 by bump balls (or solder balls or AuSn) 206, where the LEDs 204 are flip-chip LEDs. It is noted that other suitable number of LEDs may be mounted on the bottom PCB 202.

FIG. 2B shows an integrated circuit (IC) 208 and electrical wires 209 mounted on the bottom PCB 202. In embodiments, the IC 208 includes a driver circuit (or, shortly driver) for driving the LEDs 204. In embodiments, the IC 208 communicates to the LEDs 204 and other electrical components via the wires 209 and circuits 203.

FIG. 2C shows the bottom portion 200 of the LED light engine having one or more glues/adhesive drops 210 and via filling material drops 212 dispensed on the top surface of the bottom PCB 202. In embodiments, the glue drops 210 are made of dielectric material, such as silicon, and the via-filling material drops 212 are made of electrically conducting material, such as silver epoxy. As discussed in conjunction with FIG. 5A, a top PCB is mounted over the bottom PCB 202 and the adhesive drops 210 are cured so that the glue drops 210 secure the bottom PCB 202 to the top PCB. Also, the via-filling material drops 212 fill up the vias formed in the top PCB, providing electrical connection between electrical components on the top and bottom PCBs.

FIG. 2D shows a top view of the bottom portion 200 of the LED light engine in FIG. 2C in accordance with embodiments of the present invention. In FIG. 2D, only sixteen LEDs 204 and two ICs 208 are shown. However, it should be apparent to those of ordinary skill in the art that other suitable number of LEDs and ICs may be mounted on the bottom PCB 202. Also, other suitable electrical circuits 203, such as electrical wires, may be formed on the top surface of the bottom PCB 202.

Figure 3A:
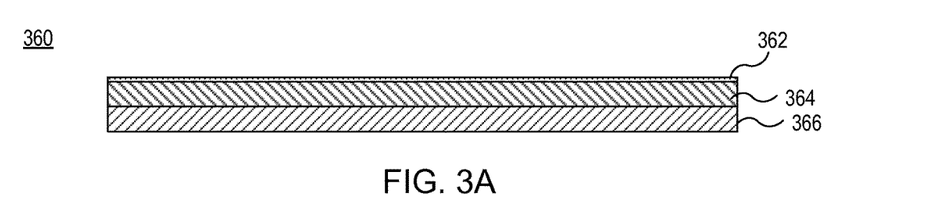
FIGS. 3A and 3B show two types of substrates that can be used to make the bottom PCB in FIG. 2D in accordance with embodiments of the present invention.
Figure 3B:
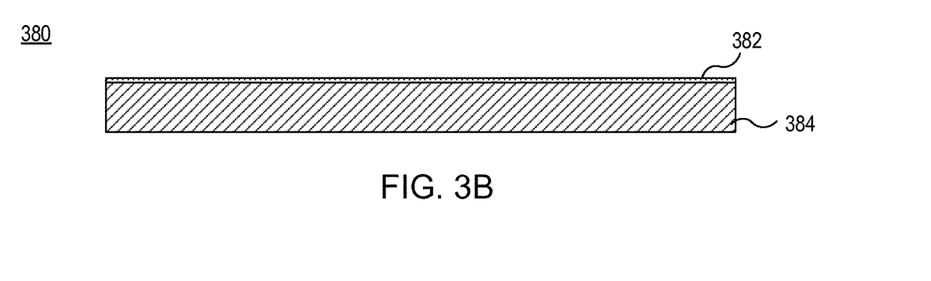

FIGS. 3A and 3B show two types of PCBs that can be used to make the bottom PCB 202 in FIG. 2D in accordance with embodiments of the present invention. The PCB 360 in FIG. 3A is a metal-core-PCB (MCPCB) that includes three layers: the metal based layer 366; a dielectric layer 364; and a top metal layer 362. The top metal layer 362 may be formed of metal, such as copper, and processed by conventional wafer processing techniques, such as etching, to form electrical circuits.

The PCB 380 in FIG. 3B includes a ceramic layer 384 and a metal layer 382, where the ceramic layer is a dielectric layer. The metal layer 382 may be formed of metal, such as copper, and processed by conventional techniques, such as etching, to form electrical circuits.

Figure 3C:
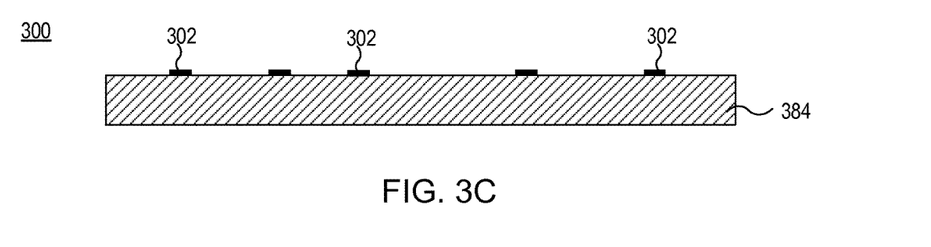
FIG. 3C shows a cross sectional view of a PCB in accordance with embodiments of the present invention.

As discussed in conjunction with FIGS. 2A-2D, the top PCB 202 includes the electrical circuits 203, where the circuits may be formed by processing the top metal layers 362 and 382 of the PCBs 360 and 380, respectively. FIG. 3C shows a PCB 300 including electrical circuits 302 formed by processing the top metal layer 382 of the PCB 380 in FIG. 3B. In embodiments, the PCB 300 and the electrical circuits 302 correspond to the bottom PCB 202 and the electrical circuits 203 in FIG. 2D, respectively. It is noted that other suitable types of substrate can be used in place of the layers 364, 366 and 384 as long as they can provide sufficient mechanical strength and electrical circuits can be formed over the top surfaces thereof.

Figure 4A:
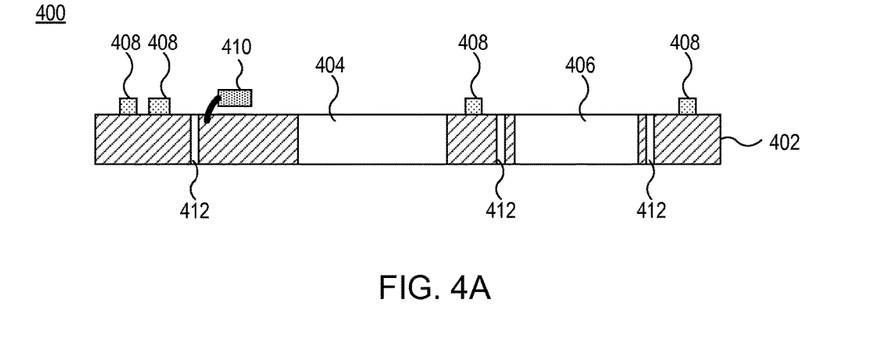
FIG. 4A shows a cross sectional view of a top PCB of an LED light engine in accordance with embodiments of the present invention.
Figure 4B:
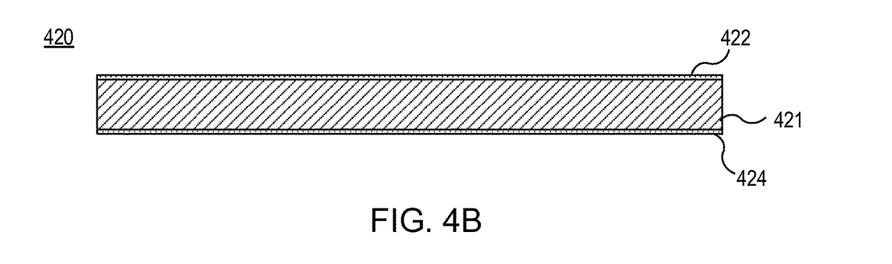
FIGS. 4B-4C shows cross sectional views of PCBs in accordance with embodiments of the present invention.
Figure 4C:
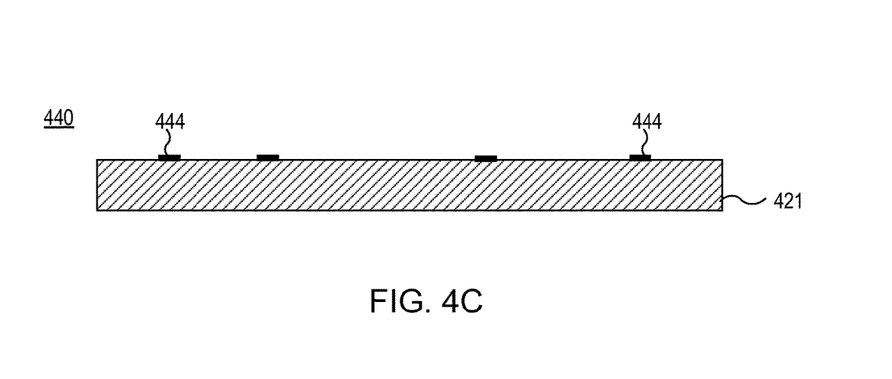

FIG. 4A shows a cross sectional view of a top portion 400 of an LED light engine in accordance with embodiments of the present invention. As depicted, the top portion 400 includes a top PCB 402 that can be made by processing a PCB 420 shown in FIG. 4B. FIG. 4B shows a cross sectional view of the PCB 420 that can be processed to form the bottom PCB 402. As depicted, the middle layer 421 is formed of suitable dielectric material, such as FR-4, and the top and bottom metal layers 422 and 424 are disposed on the top and bottom surfaces of the middle layer 421, respectively. It is noted that the PCB 420 may include only one of the two metal layers 422 and 424. For instance, as depicted in FIG. 4C, the top metal layer 422 of the PCB 420 is processed to from electrical circuits 444, where the PCB 440 corresponds to the top PCB 402.

The electrical circuits 444 may electrically couple various electrical components 408 mounted on the top PCB 402. In embodiments, the electrical components 408 may include active and passive elements, such as bridge diode, inductor, resistor, Zener diode, so on. Also, depending on the type of each component, a different method can be used to mount the components to the substrate 402. For instance, a legged component 410 may be mounted by inserting the legs into the dips formed in the top PCB 402.

The top PCB 402 is processed to form cavities (or holes) 404 and 406, where the cavities 404 and 406 accommodate the LEDs 204 and the IC 208 when the top PCB 402 is combined with the bottom PCB 202. Also, the bottom PCB 402 is processed to form one or more via holes 412, where, as will be explained later, the via holes 412 are filled with electrically conducting epoxy 212 when the top PCB 402 is combined with the bottom PCB 202.

Figure 5A:
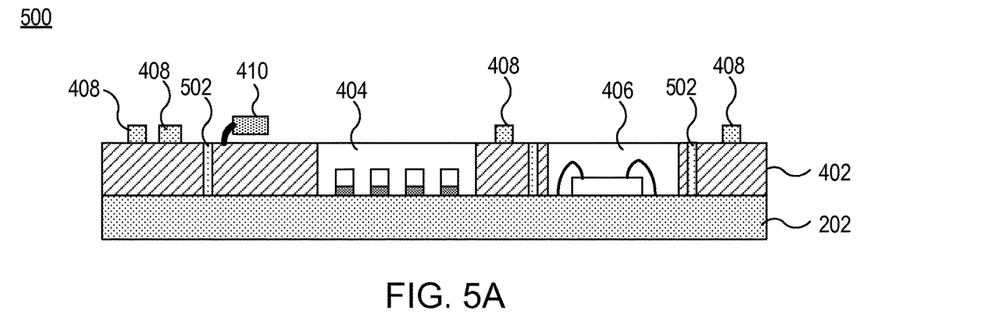
FIGS. 5A-5D show the steps for processing an LED light engine in accordance with embodiments of the present invention.

FIGS. 5A-5D show the steps for processing an LED light engine 500 in accordance with embodiments of the present invention. As described in conjunction with FIG. 2C, one or more glue/adhesive drops 210 and via filling material drops 212 are dispensed on the top surface of the bottom PCB 202. Then, as depicted in FIG. 5A, the top PCB 402 in FIG. 4 is mounted on the bottom PCB 202 in FIG. 2C and the glue drops 210 are cured to hold the top and bottom PCBs as an integral body of the LED light engine 500. It should be apparent to those of ordinary skill in the art that the glue drops 201 are squeezed to apply the glue to both the top and bottom PCBs.

Upon mounting the top PCB 402 on the bottom PCB 202, the via filling material from the drops 212 fills in the via holes 412 of the top PCB so that the vias 512 electrically couples one or more components of the top PCB 402 to one or more components of the bottom PCB 202. It is noted that the vias 412 may be filled after the top PCB 402 is secured to the bottom PCB 202 by the glue 210.

Figure 5B:
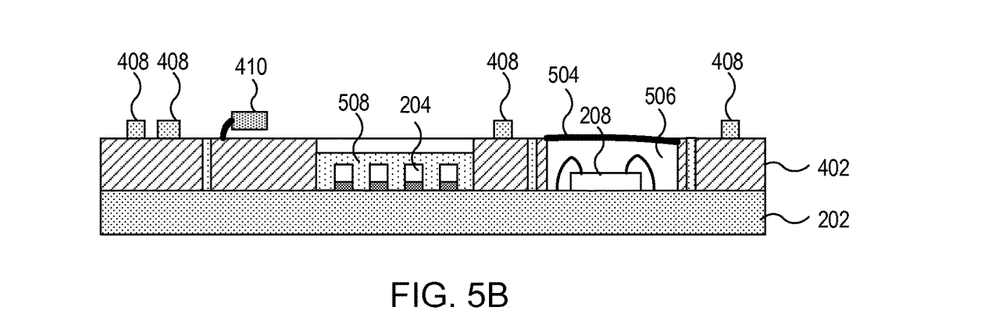

As depicted in FIG. 5B, a phosphor containing material 508 is potted over the LEDs 204 to thereby encapsulate the LEDs 204, where the phosphor is excited by the light emitted from the LEDs to emit light having an intended wavelength range, i.e., the phosphor changes the intensity distribution over the wavelength of the light emitted by the LED. In embodiments, silicon containing phosphor is applied over the LEDs 204 and cured so that the layer 508 protects the LEDs as well as changes the wavelength range of the light from the LEDs. Also, a cap 504 for protecting the IC 208 may be disposed over the IC 208. In embodiments, the space 506 between the cap 504 and IC 208 is filled with a sealing material so that the IC 208 is hermetically sealed.

Figure 5C:
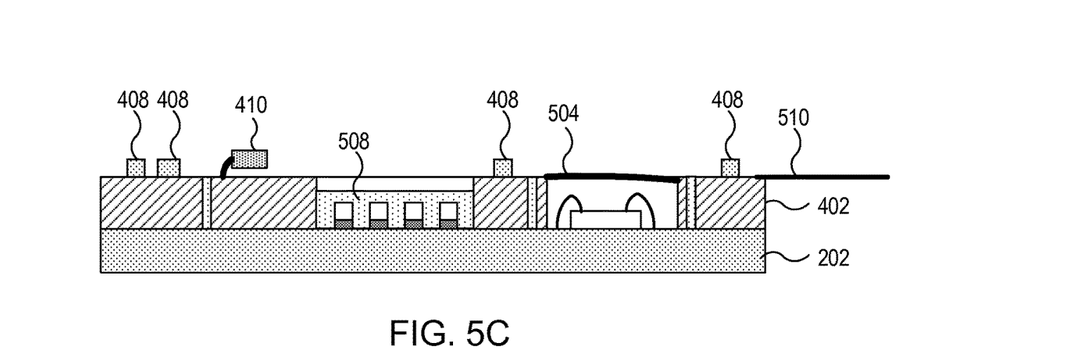
Figure 5D:
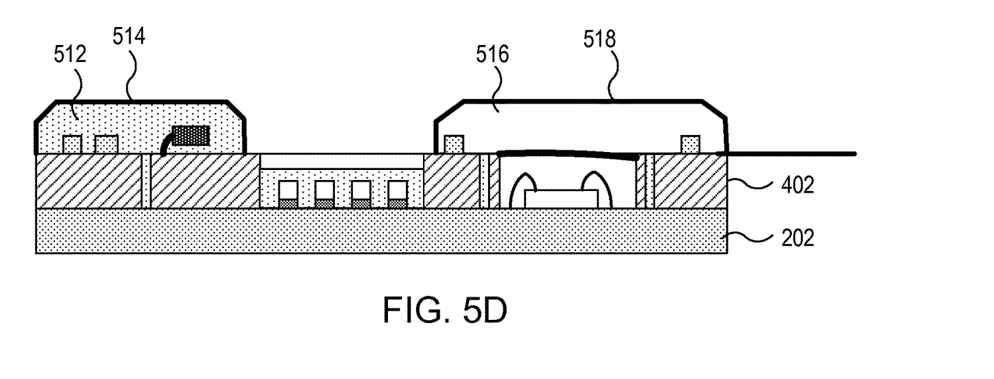

As depicted in FIG. 5C, one or more electrical wires 510 are coupled to the LED light engine so that the LED light engine can communicate to other electrical components, such as power source. FIG. 5D shows covers 514 and 518 for protecting the electrical components disposed on the substrate 402. In embodiments, a suitable material may fill in the space 512 (or 516) between the cover 514 (or 518) and the electrical components. It should be apparent to those of ordinary skill in the art that other suitable number and types of covers/filling materials may be used to protect the electrical components from mechanical and/or thermal damages. For instance, the material filling the space 512 is formed of glue so that the cover 514 is secured to the top PCB 402.

Figure 6A:
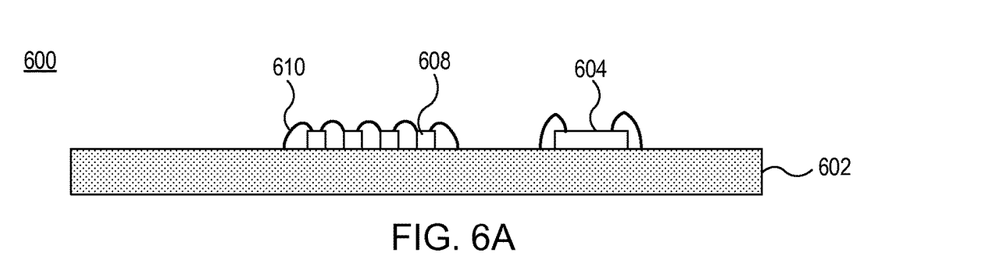
FIGS. 6A-6B show cross sectional views of various types of LEDs and integrated circuits (ICs) for driving the LEDs in accordance with embodiments of the present invention.
Figure 6B:
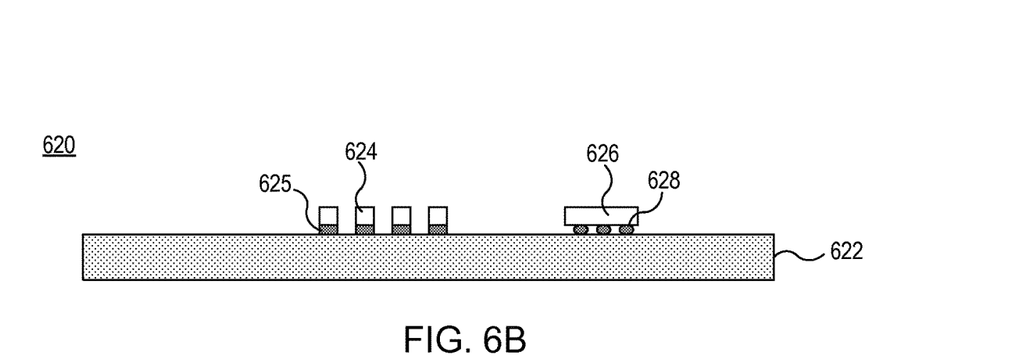

FIGS. 6A-6B show cross sectional view of various types of LEDs and integrated circuits (ICs) for driving the LEDs in accordance with embodiments of the present invention. As depicted in FIG. 6A, the bottom portion 600 of the LED light engine is similar to the bottom portion in FIG. 2B, with the difference that the LEDs 608 are lateral LEDs. The LEDs 608 are electrically coupled to each other by electrical wires 610 and to the electrical circuits formed on the top surface of the bottom PCB 602. The IC 604 are deigned to drive the LEDs 608.

As depicted in FIG. 6B, the bottom portion 620 is similar to the bottom portion in FIG. 2B, with the difference that the IC 626 is mounted on the bottom PCB 622 by bump balls 628. The bump balls (or solder balls) 628 not only provide electrical connection between the IC 626 and the electrical circuits formed on the top surface of the substrate 622, but also mechanically secure the IC 626 to the bottom PCB 622. The IC 626 is designed to drive the LEDs 624, where the LEDs 624 are secured to the bottom PCB 622 by bump balls 625.

Figure 7:
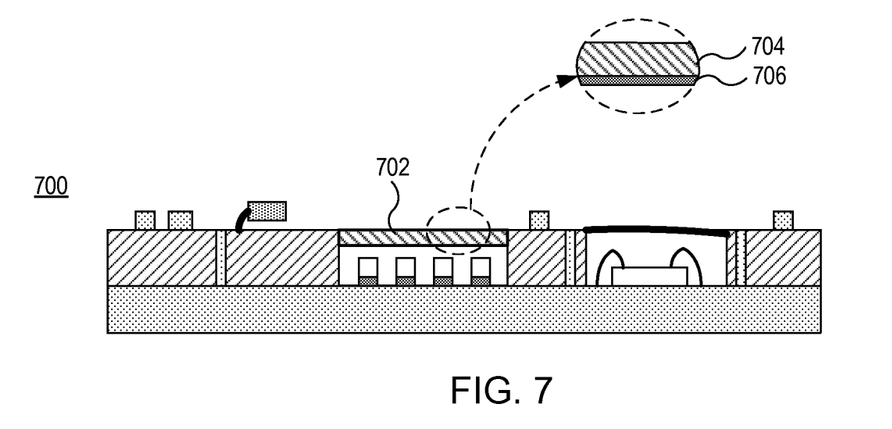
FIGS. 7 and 8 show cross sectional views of LED light engines in accordance with embodiments of the present invention.
Figure 8:
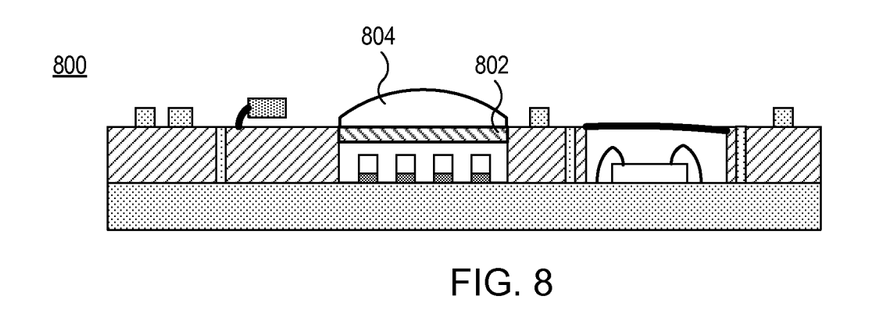

FIGS. 7-8 show cross sectional views of LED light engines in accordance with embodiments of the present invention. As depicted in FIG. 7, the LED light engine 700 is similar to the LED light engine in FIG. 5B, with the difference that a remote phosphor plate 702 is disposed over the LEDs in place of the potted phosphor containing layer 508. As shown in the inset diagram, the remote phosphor plate 702 includes a phosphor containing layer 706 that is deposited beneath the bottom surface of the substrate 704 and faces the LEDs. In embodiments, the substrate 704 is formed of transparent material and passes through the light emitted by the phosphor in the layer 706.

As depicted in FIG. 8, the LED light engine 800 is similar to the LED light engine 700 in FIG. 7, with the difference that an optical device 804 is disposed over the remote phosphor plate 802 that is similar to the plate 702. In embodiments, the optical device 804 is a lens for steering the light from the remote phosphor plate 802.

It is noted that an optical device similar to the optical device 804 may be disposed over the potted phosphor containing layer 508 so that the light from the phosphor containing layer 508 is steered by the optical device.

Figure 9:
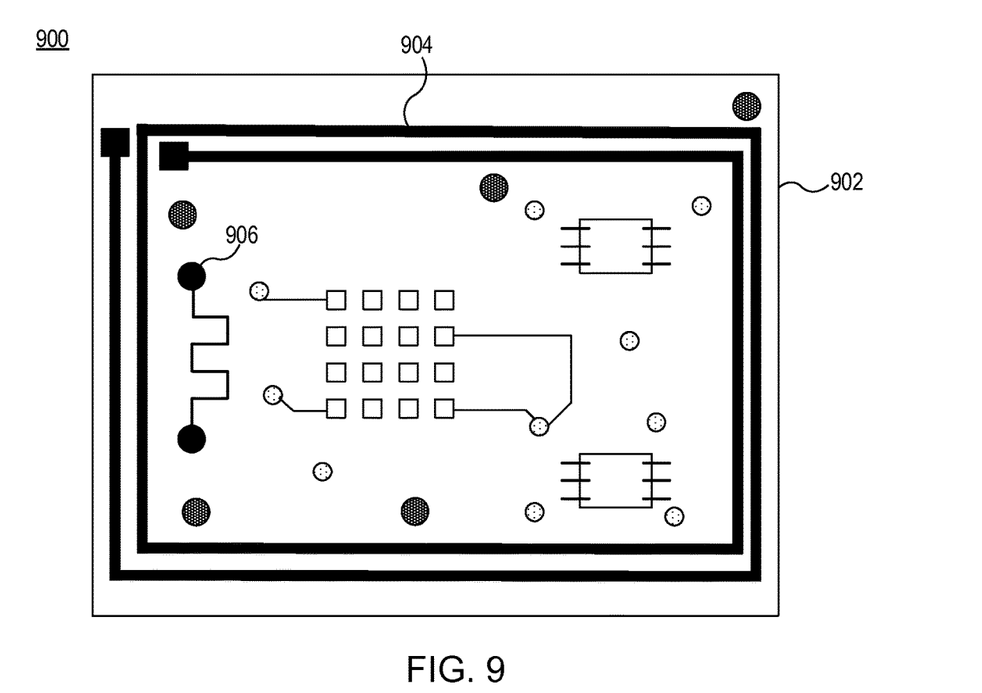
FIG. 9 shows a top view of a bottom PCB in accordance with embodiments of the present invention.

As describe in conjunction with FIGS. 3A-3B, the top layer 362 (or 382) may be patterned by suitable process, such as etching, to form various electrical components. FIG. 9 shows a top view of a bottom portion of the LED light engine 900 in accordance with embodiments of the present invention. As depicted, the bottom portion 900 is similar to the bottom portion 200 in FIG. 2D, with the difference that a spiral inductor 904 and meander line resistor 906 are patterned on the top surface of the bottom PCB 902. It is noted that the other suitable types of electrical components/circuits may be deposited (or, patterned) on the top surface of the bottom PCB 902.

It should be understood, of course, that the foregoing relates to exemplary embodiments of the invention and that modifications may be made without departing from the spirit and scope of the invention as set forth in the following claims.

What is claimed is:

1. A light emitting diode (LED) light engine, comprising:
   an LED;
   a bottom printed circuit board (PCB), the LED being securely mounted to the bottom PCB;
   a top PCB secured to the bottom PCB, the top PCB including a first cavity for receiving the LED therein;
   an LED driver securely mounted to the bottom PCB; and
   the top PCB including a second cavity for receiving the LED driver therein.

2. A light emitting diode (LED) light engine as recited in claim 1, wherein the LED is a flip-chip LED and the LED is secured to the bottom PCB by a bump ball.

3. A light emitting diode (LED) light engine as recited in claim 1, wherein the LED is a lateral LED and electrically coupled to the bottom PCB by a wire.

4. A light emitting diode (LED) light engine as recited in claim 1, wherein the LED driver is secured to the bottom PCB by a bump ball.

5. A light emitting diode (LED) light engine as recited in claim 1, wherein the LED driver is electrically coupled to the bottom PCB by a wire.

6. A light emitting diode (LED) light engine as recited in claim 1, wherein the top PCB includes a via for electrical communication with the bottom PCB.

7. A light emitting diode (LED) light engine as recited in claim 1, further comprising:
   a layer deposited over the LED and formed of material containing a phosphor.

8. A light emitting diode (LED) light engine as recited in claim 7, further comprising:
   an optical element disposed over the layer and configured to steer a light emitted by the phosphor.

9. A light emitting diode (LED) light engine as recited in claim 1, further comprising:
   a plate disposed over the LED, secured to the top PCB and including a layer formed of material containing a phosphor.

10. A light emitting diode (LED) light engine as recited in claim 9, further comprising:
    an optical element disposed over the plate and configured to steer a light emitted by the phosphor.

11. A light emitting diode (LED) light engine as recited in claim 1, further comprising:
    an optical element disposed over the plate and configured to steer a light emitted by the phosphor.

12. A light emitting diode (LED) light engine as recited in claim 1, further comprising:
    a cap secured to the top PCB, disposed over the LED driver, and configured to protect the LED driver.

13. A light emitting diode (LED) light engine as recited in claim 12, further comprising:
    a sealing material disposed between the cap and the LED driver.

14. A light emitting diode (LED) light engine as recited in claim 1, further comprising:
    an electrical component securely mounted to a top surface of the top PCB; and
    a cover disposed over the electrical component and configured to protect the electrical component.

15. A light emitting diode (LED) light engine, comprising:
    an LED;
    an LED driver for driving the LED
    a bottom printed circuit board (PCB), the LED and the LED driver being securely mounted to the bottom PCB; and a top PCB secured to the bottom PCB, the top PCB including first and second cavities for receiving the LED and the LED driver therein, wherein the LED is a lateral LED or a flip-chip LED.

* * * * *